(12) United States Patent
Kawase et al.

(10) Patent No.: US 8,604,677 B2
(45) Date of Patent: Dec. 10, 2013

(54) PIEZOELECTRIC DEVICES INCLUDING FREQUENCY-ADJUSTMENT UNITS

(75) Inventors: Yuichi Kawase, Saitama (JP); Toshiaki Motegi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 283 days.

(21) Appl. No.: 13/117,495

(22) Filed: May 27, 2011

(65) Prior Publication Data

US 2011/0291524 A1    Dec. 1, 2011

(30) Foreign Application Priority Data

May 28, 2010    (JP) .................................. 2010-122288

(51) Int. Cl.
  *H03H 9/21*    (2006.01)
(52) U.S. Cl.
  CPC ....................................... *H03H 9/21* (2013.01)
  USPC ............................ 310/370; 310/312; 310/348
(58) Field of Classification Search
  CPC . H03H 9/0595; H03H 9/1021; H03H 9/1035; H03H 9/21
  USPC .......................... 310/312, 340, 344, 348, 370
  See application file for complete search history.

(56) References Cited

U.S. PATENT DOCUMENTS

2010/0301954 A1*    12/2010    Fukuda ...................... 331/116 R

FOREIGN PATENT DOCUMENTS

| JP | 2003-060470 | 2/2003 |
| JP | 2003-332872 | 11/2003 |
| JP | 2009-225219 | 10/2009 |
| JP | 2009-253622 | 10/2009 |

OTHER PUBLICATIONS

Office Action for related Japanese Patent Application No. 2010-122288, 3 pages, Jul. 2, 2012 (in Japanese).

* cited by examiner

*Primary Examiner* — Derek Rosenau
(74) *Attorney, Agent, or Firm* — Klarquist Sparkman, LLP

(57) ABSTRACT

The piezoelectric devices allow outside-in adjustment of their vibration frequency. An exemplary piezoelectric device includes a tuning-fork type piezoelectric vibrating piece mounted inside a package. The vibrating piece has a base fabricated of a piezoelectric material, a pair of vibrating arms extending parallel from the base in a predetermined direction, and a frequency-adjustment unit situated on the distal ends of the vibrating arms. The package includes first metal films on the inner main surface thereof where an external laser beam can be irradiated. The frequency-adjustment unit includes a transparent region extending in a predetermined direction, allowing the laser beam, passing through the lid of the package, to be incident on second metal films by passing through the transparent regions. The laser beam also can be incident on first metal films without also being incident on the second metal films, by passing through the lid but not through the transparent regions.

15 Claims, 11 Drawing Sheets

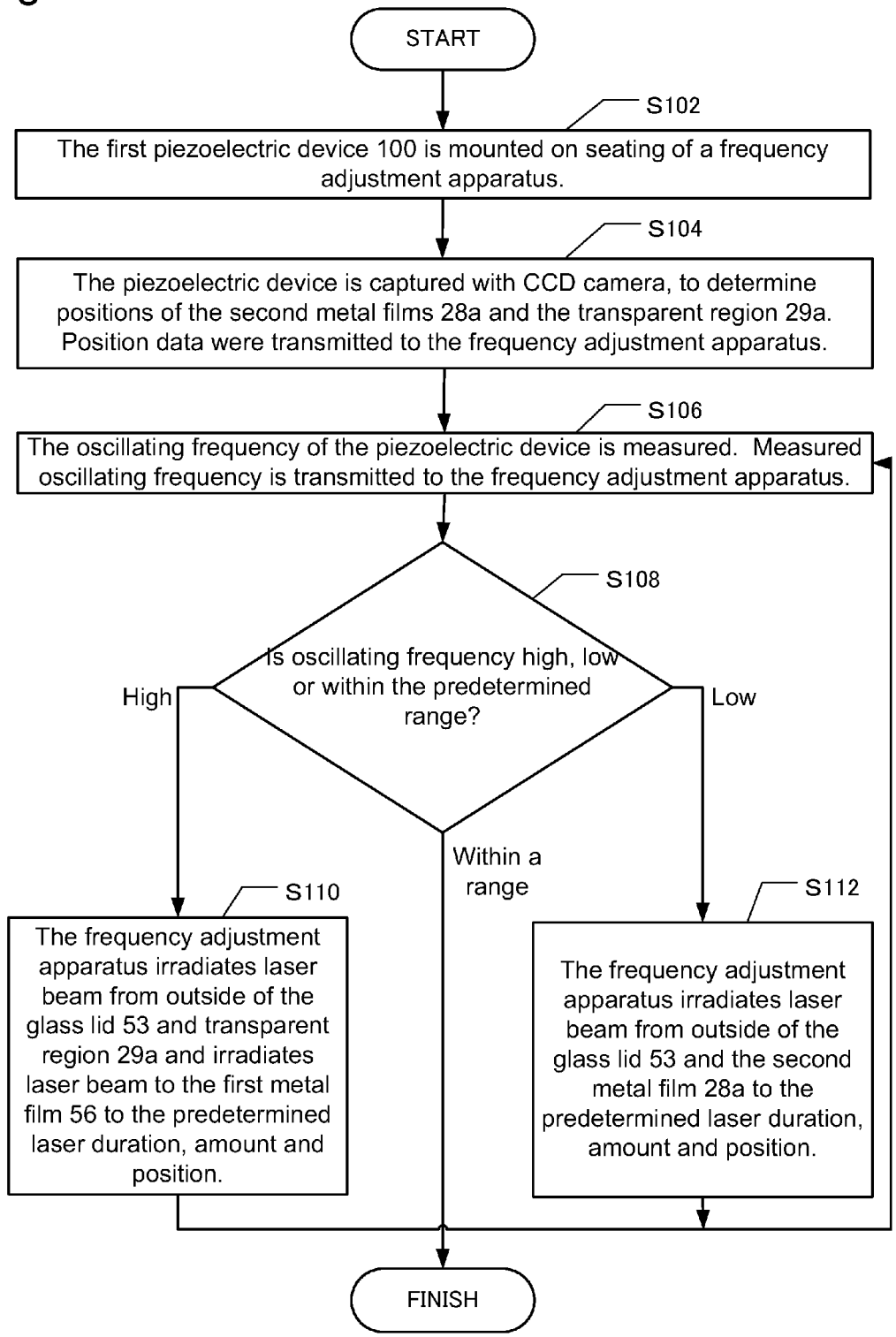

PIEZOELECTRIC DEVICES INCLUDING FREQUENCY-ADJUSTMENT UNITS

CROSS-REFERENCE TO RELATED APPLICATION

This application claims priority to and the benefit of Japan Patent Application No. 2010-122288, filed on May 28, 2010, in the Japan Patent Office, the disclosure of which is incorporated herein by reference in its entirety.

FIELD

This disclosure pertains to, inter alfa, piezoelectric devices that comprise a pair of vibrating arms and a means for adjusting their vibration frequency.

DESCRIPTION OF THE RELATED ART

In the general technology of fabricating piezoelectric vibrating devices of the tuning-fork type, the vibration frequency produced by the electrically excited vibration arms is usually adjusted by evaporating or ablating away portions of metal films formed on the distal ends of the vibrating arms using a laser beam. For example, Japan Unexamined Patent Application No. 2003-060470 discusses tuning-fork type piezoelectric vibrating pieces of which the vibrating arms initially have a lower vibration frequency than specified. The vibration frequency is increased by evaporating away portions of metal films on the distal ends of the arms, which reduces the vibratable mass of the arms. It is also possible to decrease the initial frequency of vibration produced by a tuning-fork type piezoelectric vibrating piece by vapor-depositing additional metal on the distal ends of the vibrating arms, thereby increasing the vibratable mass of the arms. The source of this additional metal is a region thereof on or near a base plate located beneath the arms. Impingement of a laser beam on the metal region evaporates some of the metal, and the evaporated metal deposits on the arms.

In conventional methods, whenever metal is laser-evaporated from the tips of the vibrating arms, the vibration frequency of the arms is increased by a large increment because the metal films were initially formed on the distal ends of the vibrating arms. This increases the difficulty of removing only a desired amount of metal from the ends of the arms. On the other hand, to reduce vibration frequency by a large amount, a large amount of source metal is required to supply a sufficient amount for deposition on the distal ends of the vibrating arms. Usually, this supply of metal is located on the base plate near the bases of the vibrating arms, which is a difficult region to access using a laser beam. Another complication is the difficulty of producing a controlled laser beam that the produces a desired amount and duration of irradiation required for accurately and precisely producing a specified adjustment of vibration frequency. Constant beam adjustments are usually required. This substantially increases the difficulty of adjusting the amount of irradiation from the laser beam to achieve adjustments (especially small adjustments) of the vibration frequency produced by a tuning-fork type piezoelectric vibrating piece.

The present invention provides, inter alia, piezoelectric devices of which the vibration frequency can be increased or decreased easily without having to make large changes to the intensity and/or duration of irradiation produced by a laser. The invention includes methods for adjusting the vibration frequency of piezoelectric devices.

SUMMARY

The invention is set forth in the context of several aspects thereof.

A first aspect is directed to piezoelectric devices that include a tuning-fork type piezoelectric vibrating piece situated inside a package. The piezoelectric vibrating piece comprises a base fabricated of a piezoelectric material, first and second vibrating arms extending from the base parallel to each other in a first direction, and respective "frequency-adjustment units" on respective distal ends of the vibrating arms. The package comprises a first metal film on an inner main surface of the package at which a laser beam can be irradiated. Each frequency-adjustment unit comprises a second metal film extending at least in the first direction and a transparent region extending, parallel to the second metal film, at least in the first direction. The transparent region is transmissive to a laser beam having a power and wavelength sufficient to evaporate material from the first and second metal films if the laser beam is incident on respective ones or both of the first and second metal films.

The frequency-adjustment unit desirably includes a transparent region and a region of the second metal film. The transparent region is transparent to at least some wavelengths of the laser light. The second metal film is accessible by the laser beam without the beam having to pass through the transparent region. The first metal film is accessible by the laser beam after the beam has passed through the transparent region.

In some embodiments the package comprises a base plate having a bottom surface that faces the piezoelectric vibrating piece in the package. The package also comprises a laser-transparent lid having a ceiling surface that faces the piezoelectric vibrating piece in the package, thereby sealing the package. In such a package configuration, in some embodiments the first metal films can be situated on the bottom surface of the base plate.

In other embodiments the package comprises a base plate that is transparent to the laser and that has a bottom surface facing the piezoelectric vibrating piece in the package. The package also comprises a lid having a ceiling surface facing the piezoelectric vibrating piece in the package, thereby sealing the package. In such a package configuration, the first metal films can be situated on the ceiling surface of the lid.

The second metal film of the frequency-adjustment unit can be configured to sandwich the transparent region unit in a second direction that is orthogonal to the first direction.

In certain embodiments each vibrating aria has a width in a second direction orthogonal to the first direction. Also, each frequency-adjustment unit has a width, in the second direction, that is greater than the width of a vibrating arm in the second direction.

In some embodiments the width of each frequency-adjustment unit extends from the distal end of the respective vibrating arm to a respective distal end of the frequency-adjustment unit. This width desirably is greater than the width of the vibrating arms and can progressively increase with distance extending distally, or can be substantially uniform over the distance extending distally.

Another aspect is directed to methods for adjusting the frequency of vibration produced by a piezoelectric device that includes a tuning-fork type piezoelectric vibrating piece mounted inside a package having an inner surface on which a first metal film is provided. The package includes at least one laser-transmissive wall. In one embodiment of this method, a frequency-adjustment unit is provided on the distal end of each vibrating arm. Each frequency-adjustment unit comprises a second metal film extending at least in a first direction and a transparent region extending, parallel to the second metal film, at least in the first direction. The piezoelectric vibrating piece is electrically energized. Then, the frequency of vibration produced by the energized piezoelectric vibrating piece is measured. To change the vibrating mass of the vibrating arms to change their vibration frequency, a laser beam is irradiated through the laser-transmissive wall of the package to the second metal film to evaporate a determined mass from the second metal film if the measured frequency is lower than a specified frequency. If the measured frequency is greater than the specified frequency, then the laser beam is irradiated through the laser-transmissive wall of the package and through the transparent region of the frequency-adjustment unit to the first metal film to evaporate the determined mass from the first metal film and deposit the determined mass onto the second metal film.

More specifically, in some embodiments, when making a coarse reduction of vibration frequency, the laser beam is irradiated through the laser-transmissive wall, through respective irradiation spots on distal ends of the transparent regions, and onto respective irradiation spots on distal ends of the first metal films. When making a coarse increase in vibration frequency, the laser beam is irradiated through the laser-transmissive wall onto respective irradiation spots in distal regions of the second metal films. When making a fine reduction in vibration frequency, the laser beam is irradiated through the laser-transmissive wall and through respective irradiation spots on proximal ends of the transparent regions onto respective irradiation spots in proximal regions of the first metal films. When making a fine increase in vibration frequency, the laser beam is irradiated through the laser-transmissive wall onto respective irradiation spots in proximal regions of the second metal films.

Thus, piezoelectric devices are provided of which the vibration frequency can be adjusted without having to change the dose of irradiation or the duration of the irradiation. This substantially reduces manufacturing defects.

BRIEF DESCRIPTION OF THE DRAWINGS

FIG. 3 is a flow-chart of an embodiment of a method for adjusting the vibration frequency of the first embodiment of a piezoelectric device.

DETAILED DESCRIPTION

Various embodiments of the subject invention are described in detail below, with reference to the accompanying drawings. In the following description, the direction in which the vibrating arms of a tuning-fork crystal vibrating piece extend is the y-axis direction. The direction of width of the vibrating arms is the x-axis direction. The direction normal to both the x-axis and the y-axis is the z-axis direction.

First Embodiment of a Piezoelectric Device

Figure 1A:
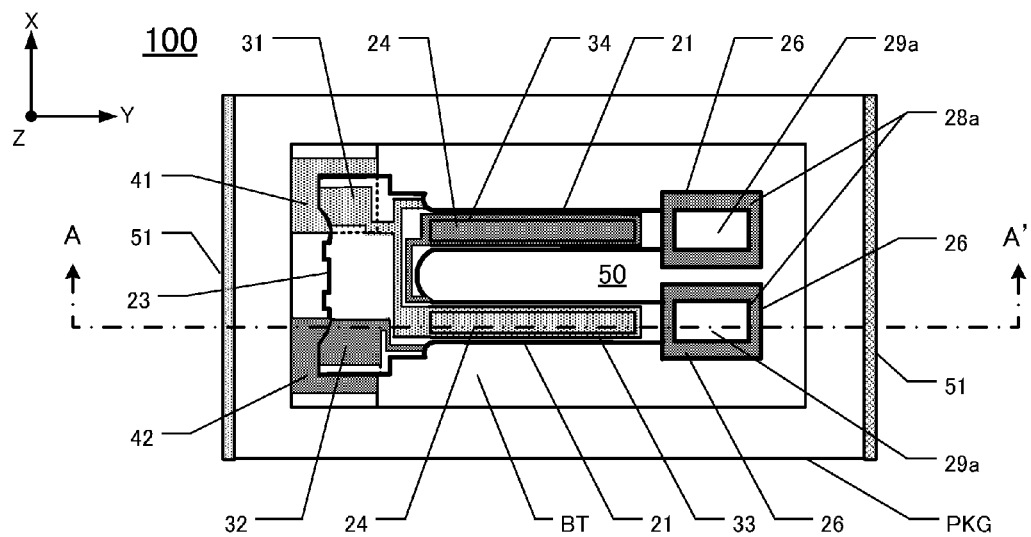
FIG. 1A is a plan view of a first embodiment of a piezoelectric device including a tuning-fork type crystal vibrating piece encased within a package.
Figure 1B:
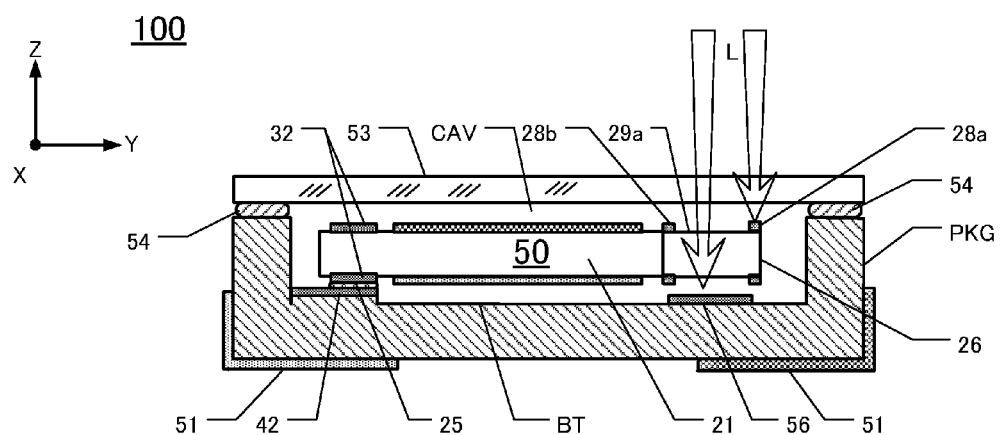
FIG. 1B is a cross-sectional view taken along the line A-A' in FIG. 1A.

FIG. 1A is a plan view of this embodiment of a piezoelectric device 100 from which the lid 53 has been removed to reveal underlying detail. FIG. 1B is a cross-sectional view along the line A-A' in FIG. 1A. The piezoelectric device 100 comprises a tuning-fork type crystal vibrating piece 50 contained within a package PKG. The crystal vibrating piece 50 comprises a base 23 and a pair of vibrating arms 21. The base 23 has a board shape and is fabricated of a crystalline material such as quartz crystal. The vibrating arms 21 extend parallel to each other in the y-axis direction from the base 23. With the exception of their distal ends, the vibrating arms 21 have a substantially constant width in the x-axis direction. On each of the upper and lower main surfaces of each vibrating arms 21 is a respective groove 24. One respective groove 24 is formed on each of the upper and lower main surfaces of one vibrating arm 21, and one respective groove 24 is formed on each of the upper and lower main surfaces of the other vibrating arm 21. These four grooves 24 serve to reduce the crystal impedance (CI) of the crystal vibrating piece 50.

On the distal end of each vibrating arm 21 is a respective wide portion 26 that is wider in the x-axis direction than most of the vibrating arm. The wide portions 26 have uniform width in the x-axis direction. Each wide portion 26 comprises a respective second metal film 28a (used for frequency adjustment, as described later below) and a respective transparent region 29a lacking any metal. The transparent region 29a is situated symmetrically on the y-axis centerline of each respective vibrating arm. Surrounding each transparent region 29a is the respective second metal film 28a. In FIG. 1B, respective second metal films 28a are formed on both the upper and lower main surfaces of each wide portion 26. In an alternative configuration, a respective second metal film 28a is provided on only one main surface of each vibrating arm. In any event, underlying crystal material is visible through the transparent region 29a. Thus, the transparent region 29a serves as a window for passage of a laser beam through the window, as described later below, to underlying structures. The wide portions 26 facilitate vibration of the arms 21 at a certain frequency whenever the arms are electrically stimulated; the wide portions 26 also facilitate making adjustments to the frequency of vibration produced by the vibrating arms.

As shown in FIG. 1A, first and second excitation electrodes 33, 34 are situated on respective first and second main surfaces of the vibrating arms 21. Whenever the excitation electrodes 33, 34 are electrically stimulated, the arms vibrate. The excitation electrodes 33, 34 extend into the grooves 24. A first base electrode 31 and second base electrode 32 are situated on the base 23. These base electrodes 31, 32 are connected electrically to the first and second excitation electrodes 33, 34, respectively.

The first and second base electrodes 31, 32, the first and second excitation electrodes 33, 34 and the second metal films 28a are all formed of a layer of gold (Au) (thickness 400 Å to 2000 Å) formed on a layer of chromium (Cr) (thickness 100 Å to 700 Å).

As noted, the piezoelectric device 100 is constructed by mounting the tuning-fork type crystal vibrating piece 50 in a cavity CAV defined in a package PKG. A respective lid 53 is bonded to the package PKG using a sealing material 54. This bonding is performed in a vacuum.

As shown in FIG. 1B, the package PKG can be, for example, a ceramic package formed by stacking multiple ceramic sheets to form a box-like structure. Mounted on the lower main (external) surface of the package PKG are external electrodes 51 used for mounting the device to a printed circuit board or the like (not shown). The external electrodes 51 are formed by application of a tungsten paste or by screen-printing. Instead of ceramic, the package PKG can be made of glass, for example.

On the bottom surface BT of the cavity CAV in the package PKG are first metal films 56 (see FIG. 2B), each being aligned in the z-axis direction with the transparent region 29a of a respective vibrating arm. Normally, in a view such as shown in FIG. 1A, the first metal films 56 would be visible though the respective transparent regions 29a. However, to clarify the size of the transparent region as shown, underlying detail of the respective first metal films 56 is not shown.

Each first metal film 56 is situated directly beneath (in the z-axis direction) the respective transparent region 29a of the wide portion 26 of the respective vibrating arm. Each first metal film 56 comprises a foundation layer of nickel (thin plate on electrode created by tungsten metal) with an overlying layer of gold.

The bottom surface BT of the cavity CAV in the package PKG also includes first and second connecting electrodes 41, 42. The first and second connecting electrodes 41, 42 are connected to respective external electrodes 51 located on the lower main surface of the package PKG. A first base electrode 31 and second base electrode 32 of the crystal vibrating piece 50 are connected to the first and second connecting electrodes 41, 42, respectively, via respective units of electrically conductive adhesive 25.

The lid 53 is made of a material transparent to a laser beam. Exemplary materials include glass and quartz crystal. The lid 53 is bonded to the package PKG using a sealing material 54 applied to the top-edge surface of the side wall 59 of the package PKG.

As shown in FIG. 1B, the laser beam L can be irradiated into the cavity CAV from outside the lid 53 after the lid 53 has been sealed onto the side wall 59 of the package PKG. The laser beam L irradiates the first metal films 56 by passing through the lid 53 and respective transparent regions 29a. The laser beam also irradiates the second metal films 28a by passing through the lid 53, depending upon the x-axis or y-axis directions of the irradiating position. But, during irradiation of the second metal films 28a, the laser beam L need not, and does not, pass through the second metal films 28a.

Figure 2A:
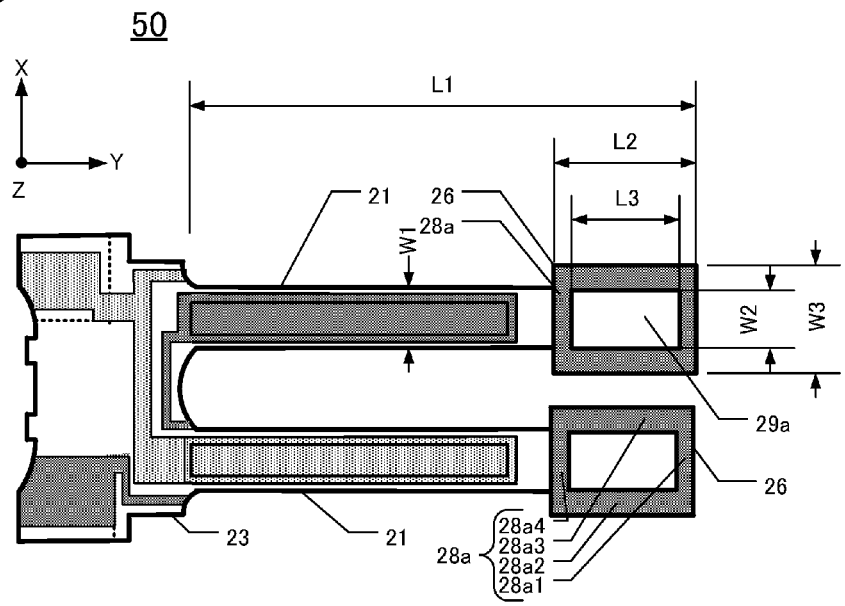
FIG. 2A is a plan view of a transparent region on the end of a vibrating arm of the first embodiment of a crystal vibrating piece.

FIG. 2A shows exemplary size relationships between the vibrating arms 21 and their respective wide portions 26. FIG. 2A also shows the size relationships between the transparent regions 29a and the respective first metal films 56 used for making frequency adjustments. FIG. 2A also depicts the relative widths of the vibrating arms 21 and the transparent regions 29a. FIG. 2A also depicts the spatial relationship of the first metal films 56 with the transparent regions 29a.

Continuing further with FIG. 2A, the length L1 of each vibrating arm 21 of this embodiment is in the range of 1.00 mm to 1.50 mm, and the width W1 of each vibrating arm 21 is in a range of 80 μm to 100 μm. Each wide portion 26 has width W3 in a range of 110% to 130% of W1, and length L2 in a range of 10% to 30% of L1.

The width W2 of the transparent region 29a is either approximately equal to W1 or approximately equal to about (W3)/2. The length L3 (y-axis direction) of the transparent region 29a is in the range of 60% to 90% of L2 (y-axis direction). Hence, the transparent region 29a is narrower (y-axis direction) than the respective wide region 26. The second metal films 28a are frame-shaped, with four frame-like sides 28a1-28a4. These sides 28a1-28a4 define the transparent region through which the laser beam L (refer to FIG. 1) can pass. Desirably, each second metal film 28a has a width approximately equal to or greater than the diameter of an irradiating spot IS (FIG. 4) of the laser beam L. The sides 28a2, 28a3 of the second metal films 28a are parallel (x-axis direction) to the respective edges of the transparent region 29a.

Figure 2B:
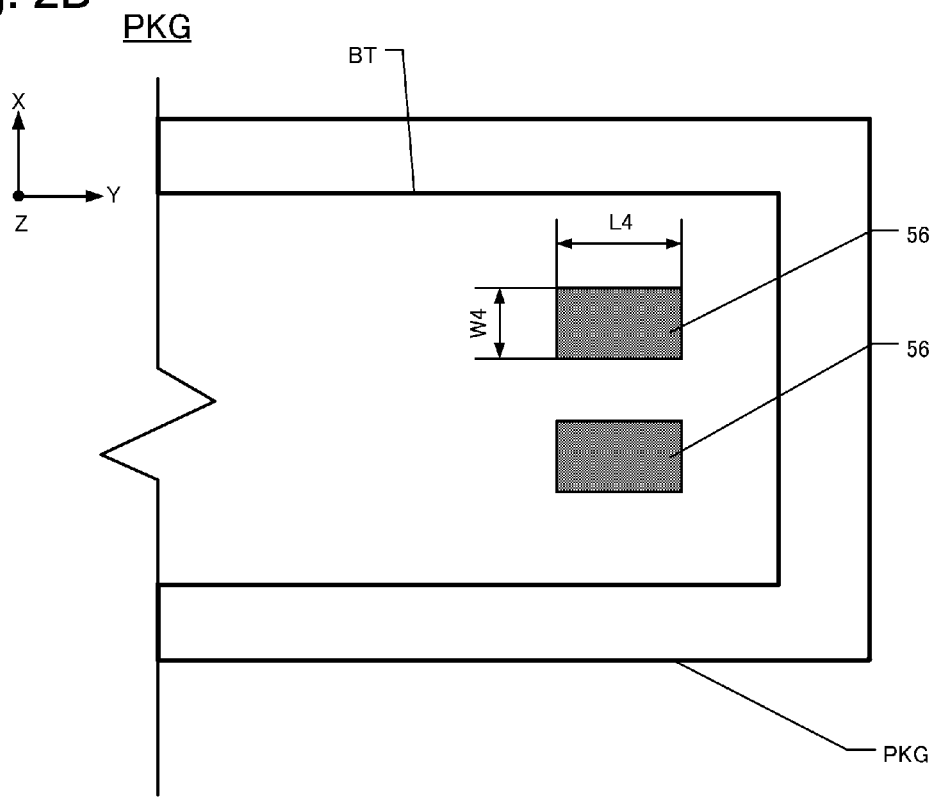
FIG. 2B is a plan view depicting relative sizes of first metal films formed on the bottom main surface of the package of the first embodiment of a crystal vibrating piece.

As shown in FIG. 2B, the width W4 of each first metal film 56 desirably is at least 8% wider than W3 of the transparent region 29a. Also, the length L4 of the first metal films 56 desirably is at least 8% greater than L3 of the transparent region 29a. A mounting device, not shown, affixes and supports the tuning-fork type crystal vibrating piece 50 in the cavity CAV in the package PKG. Simultaneously, the mounting device determines, by image processing, the position of the package PKG. Based on the processing results, the mounting device moves a hand arm that grasps the tuning-fork type crystal vibrating piece 50 and places it in the package. The crystal vibrating piece 50 may be mounted slightly out of alignment relative to a predetermined position of the cavity CAV, due to a margin of error in image-processing and to movement of the hand arm. The usual misalignment of the crystal vibrating piece 50 from the predetermined position is in the range of ±4% to ±6%. Thus, the length L4 and width W4 of the first metal films 56 desirably are at least 8% greater than the length L3 and width W3, respectively. The length L4 and width W4 of the first metal films 56 generally have no limitations, as long as each is greater than L3 and W3, respectively, by at least 8%. However, excessively large first metal films 56 are not cost-efficient.

Adjusting Vibration Frequency of First Embodiment of Piezoelectric Device

The vibration frequency produced by the first embodiment of a piezoelectric device 100 is adjustable after the crystal vibrating piece 50 has been mounted in the package PKG and the package sealed with the lid 53. FIG. 3 is a flow-chart of an exemplary method for adjusting the vibration frequency.

In step S102 the piezoelectric device 100 is mounted on a seat of a frequency-adjustment apparatus and held thereon by application of vacuum.

In step S104 the piezoelectric device mounted to the seat is imaged using a CCD camera of the frequency-adjustment apparatus. Then, the respective positions of the second metal films 28a and of the transparent region 29a are determined. Data concerning the determined positions are transmitted to a processor of the frequency-adjustment apparatus.

In step S106 the external electrodes 51 (FIG. 1) are contacted using electrical probes to obtain measurements of the vibration frequency of the piezoelectric device 100. Data concerning the measured vibration frequency are transmitted to the processor of the frequency-adjustment apparatus.

In step S108 the frequency-adjustment apparatus compares the predetermined (target) vibration frequency with the measured vibration frequency. For example, the predetermined target frequency is 32,768 Hz. The vibration frequency produced by a completed device should be within ±0.5 Hz of the target frequency, for example. If the piezoelectric device 100 connected to the frequency-adjustment apparatus produces a vibration within this target range, no frequency adjustment is required and the adjustment method is complete with respect to this particular device. On the other hand, if the measured vibration frequency is outside the target range, the method for the respective device proceeds to step S110 if the measured frequency is too high and proceeds to step S112 if the measured frequency is too low.

In step S110, if the measured vibration frequency is higher than the target range, the vibration frequency is reduced by increasing the mass of the wide portion 26 of the vibrating arms. To such end, the laser beam L outside of the glass lid 53 is irradiated onto the device such that the beam is transmitted through the lid 53 and transparent region 29a onto the first metal films 56. Impingement of the laser beam L on a first metal film 56 heats the metal film and thus causes evaporation of metal therefrom. The evaporated metal adheres to the under surface of the wide portions 26 located directly above and close to the first metal films 56. As a result, the mass of the vibrating arms 21 is increased, which correspondingly reduces the vibration frequency of the crystal vibrating piece 50 toward the specified range.

The method then returns to step S106, in which the vibration frequency of the piezoelectric device 100 is re-measured. The sequence of steps continues until the vibration frequency comes to within the specified range.

In step S112, if the measured vibration frequency is lower than the target range, the vibration frequency is increased by reducing the mass of the wide portion 26 of the vibrating arms. Two such ends, the laser beam L outside the glass lid is irradiated onto the device 100 such that the beam is transmitted through the lid 53 onto the second metal films 28a. Impingement of the laser beam L on the second metal films 28a heats the metal films sufficiently to evaporate metal therefrom. Hence, the mass of the vibrating arms 21 is reduced, which correspondingly increases the vibration frequency of the crystal vibrating piece 50 toward the specified range.

The method then returns to step S106, in which the vibration frequency of the piezoelectric device 100 is re-measured. The sequence of steps continues until the vibration frequency comes to within the specified range.

The frequency-adjustments performed in steps S110 and S112 are now described. The frequency-adjustment apparatus calculates the mass of the first metal films 56 to be removed and the optimal irradiation position of the laser beam required for reducing the difference between the measured vibration frequency and the preset target range of vibration frequency. The frequency-adjustment apparatus also calculates the mass of the second metal films 28a to be evaporated and the optimal irradiation position of the laser beam required for reducing the difference between the measured vibration frequency and the preset target range.

Figure 4A:
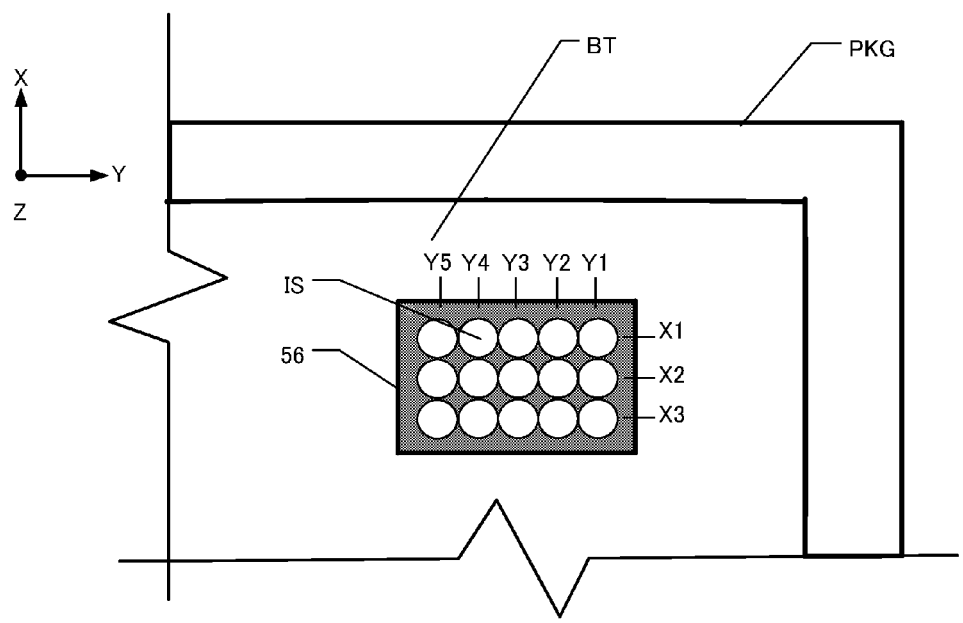
FIG. 4A is a plan view of an array of irradiation spots on a first metal film on a bottom main surface of the package. A laser beam is irradiated on selected irradiation spots to supply evaporated metal for forming metal films on the vibrating arms.
Figure 4B:
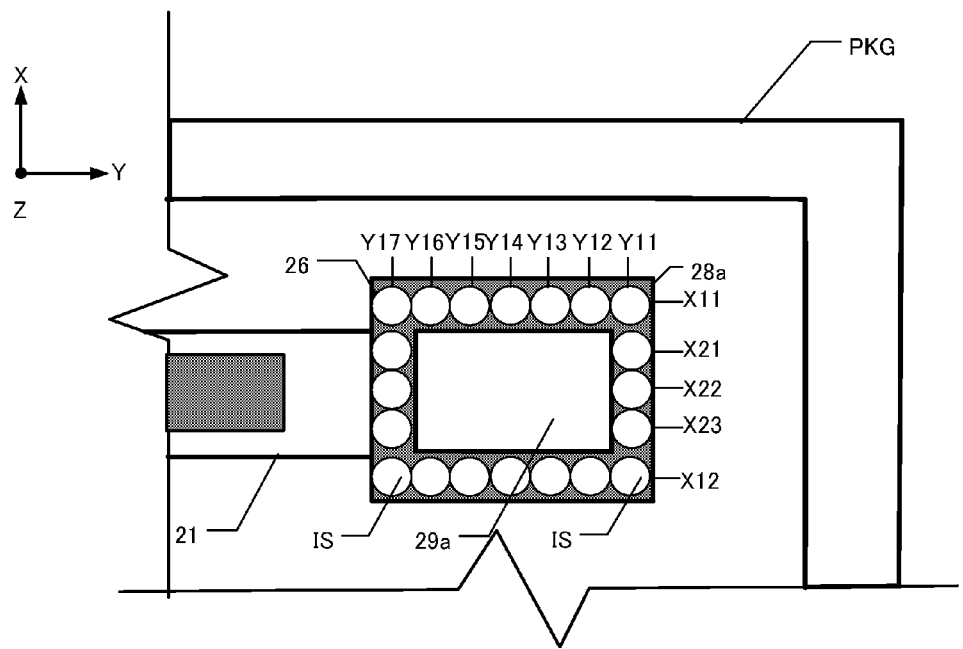
FIG. 4B is a plan view of an array of irradiation spots on a second metal film 28a on the terminal wide region on the end of a vibrating arm.

FIGS. 4A and 4B depict the irradiation spots IS that are irradiated by the laser beam L of the frequency-adjustment apparatus. In FIG. 4A each irradiation spot IS is a respective position at which the laser beam can be incident on a first metal film 56 on the bottom surface BT of the package. FIG. 4B depicts irradiation spots IS on the second metal films 28a.

As described previously with respect to FIG. 2B, the width W4 of each first metal film 56 is greater than the width W3 of the transparent region 29a. Also, the length L4 of each first metal film 56 is greater than the length L3 of the transparent region 29a. FIG. 4A shows a situation in which the center of the transparent region 29a is aligned with the center of the respective first metal film 56. Hence, the irradiating spots IS are arranged such that a total of fifteen coordinates (X1, Y1) to (X3, Y5) are established. The coordinates are arranged in three rows in the x-axis direction and five rows in the y-axis direction, and do not overlap each other.

The amount by which the vibration frequency of the piezoelectric device 100 can be adjusted depends upon the irradiation position on the first metal films 56. The laser beam L is irradiated onto the irradiation spots IS in the first row (X1, Y1), (X2, Y1), and (X3, Y1) to make a coarse frequency adjustment, since the largest reductions of vibration frequency are achieved by irradiating the first row. Irradiating the laser beam L onto the irradiation spots IS in the fifth row (X1, Y5), (X2, Y5), and (X3, Y5) results in fine adjustments of vibration frequency since the smallest reductions of vibration frequency are achieved by irradiating the fifth row. As the laser beam L is irradiated onto one irradiation spot IS in any of the first to fifth rows, the frequency-adjustment apparatus measures the corresponding reduction in vibration frequency (in Hz). Frequency-adjustment apparatus stores this measurement data. The frequency-adjustment apparatus irradiates the laser beam L on specific spots, it assigns a respective irradiation dose to each row based on the difference between the measured vibration frequency and the target frequency, thereby lowering the vibration frequency produced by the piezoelectric device 100.

In FIG. 4B, the irradiation spots IS are arranged so that a total of fourteen spots are provided at respective coordinates (X11, Y1) to (X12, Y17). The coordinates are arranged in two rows each extending in the x-axis direction and seven rows each extending in the y-axis direction. The rows do not overlap each other. Note that the first row and seventh row each contain three extra irradiation spots IS arrayed in the x-axis direction (X21, X22, and X23).

The amount by which the vibration frequency of the piezoelectric device 100 can be changed varies with the irradiation positions on the second metal films 28a. The laser beam L is irradiated onto the irradiation spots IS in the first row (X11, Y11) and (X12, Y11) to make coarse adjustments of vibration frequency. This is because the vibration frequency is increased by the largest increments whenever the beam is irradiated on the first row. The laser beam and L is irradiated onto irradiation spots IS in the seventh row (X11, Y17) and (X12, Y17) to make fine adjustments of vibration frequency. This is because the vibration frequency is increased by the smallest increments whenever the beam is irradiated on the seventh row. Hence, if the measured vibration frequency is lower than the target frequency by a large difference, the laser beam L is first irradiated onto the irradiating spots IS in the first row (X21, X22, and X23). On the other hand, if measured vibration frequency is lower than the target frequency by a small difference, the laser beam L can be irradiated onto the irradiation spots IS in the seventh row (X21, X22, and X23), for example. As the frequency-adjustment apparatus irradiates the spots, the respective radiation dose is applied to each irradiated spot, based on the difference between the measured vibration frequency and the target frequency. Thus, the apparatus increases the frequency of vibration produced by the piezoelectric device 100.

As described above, increasing the vibration frequency by making combinations of coarse and fine adjustments and reducing the vibration frequency by making combinations of coarse and fine adjustments are now possible since the transparent region 29a has sides that parallel to the sides 28a2 and 28a3 of the second metal films 28a. Also, since the transparent region 29a is located inside the frame defined by the sides 28a1 to 28a4 of the second metal films 28a, metal irradiated by the laser beam L and evaporated from the first metal frame 56 adheres to the wide portions 26 of the vibrating arms.

In FIGS. 4A and 4B, all irradiation spots IS are located such that the respective coordinates do not overlap. Alternatively, the spots can be located such that half of each spot overlaps the adjacent spot. Whenever a part of one irradiation spot IS overlaps a part of another irradiation spot, further fine adjustment of the vibration frequency is possible. In the second and other embodiments, each irradiation spot IS half-overlaps the adjacent irradiation spot.

Second Embodiment of Piezoelectric Vibrating Device

Figure 5A:
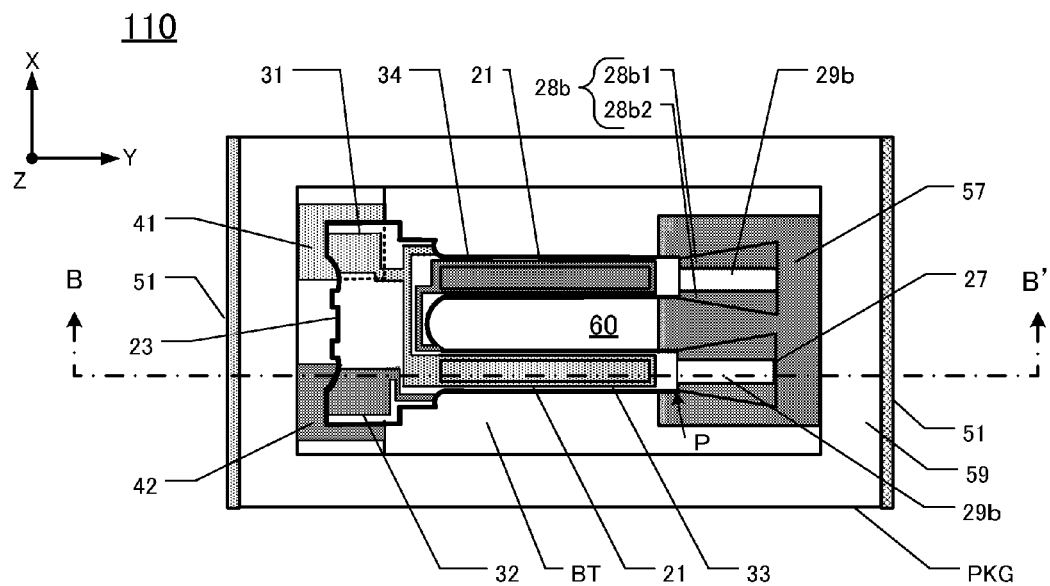
FIG. 5A is a plan view of a second embodiment of a piezoelectric device.
Figure 5B:
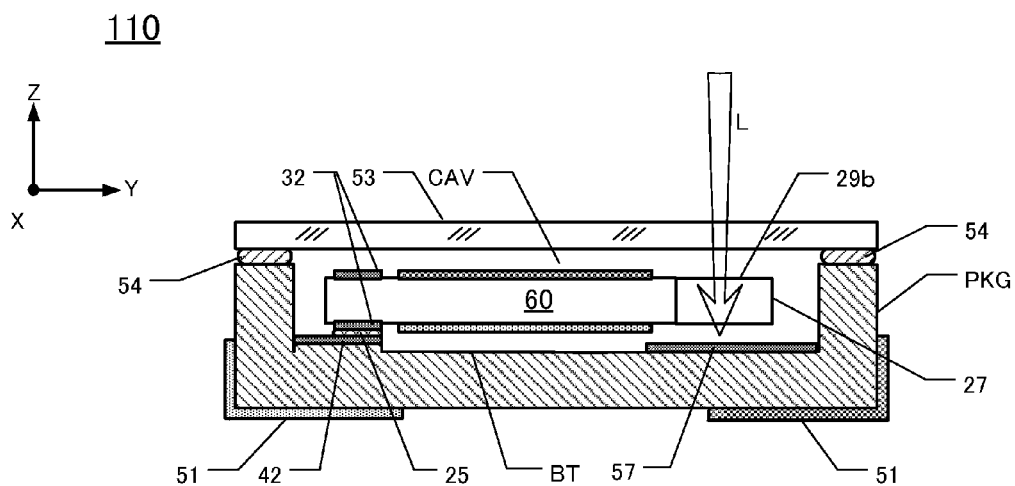
FIG. 5B is a cross-sectional view along the line B-B' in FIG. 5A.

FIG. 5A is a plan view of this embodiment of a piezoelectric device 110 (with lid 53 removed) and FIG. 5B is a cross-section along the line B-B' line of FIG. 5A. The principal difference between second piezoelectric devices 110 and 100 concerns the particular tuning-fork type crystal vibrating piece 60 used in the second embodiment compared to the first embodiment. Also, the second embodiment 110 has one large first metal film 57, instead of a pair of first metal films 56 as used in the first embodiment.

The piezoelectric device 110 is manufactured by placing the tuning-fork type crystal vibrating piece 60 inside a cavity CAV defined by a package PKG, followed by bonding a lid 53 to the package PKG using sealing material 54. Bonding of the lid to the package is performed in a vacuum. In this embodiment, components that are similar to corresponding components of the first embodiment had the same respective reference numerals and are not described further below.

As shown in FIG. 5A, each vibrating arm 21 of the crystal vibrating piece 60 has a respective distal fan-shaped wide portion 27. The wide portion 27 gradually widens from the point P to the distal ends, forming fan-shaped structures. Each wide portion 27 includes a respective second metal film 28b used for frequency adjustment. Each wide portion 27 also includes a respective transparent region 29b.

The width of each transparent region 29b is about equal to or narrower than the width of the respective vibrating arm 21, the latter having a substantially uniform width. The transparent regions 29b extend in the y-axis direction coextensively with the length of the respective wide portions 27. Hence, each of the second metal films 28b has a substantially triangular profile, comprising the sides 28b1 and 28b2. The sides 28b1 and 28b2 are parallel (in the x-axis direction) to the transparent region 29b. These sides enclose a region in which the laser beam L can be irradiated (refer to FIG. 6B). On the bottom surface BT of the cavity CAV, in the package PKG, is a large first metal film 57. The first metal film 57 is situated beneath the transparent regions 29b. The width of the first metal film 57 desirably is in the range of 220% to 400% of the width of one fan-shaped wide portion 27. The length of the first metal film 57 desirably is in the range of 120% to 150% of the length of the wide portion 27. The crystal vibrating piece 60 may be mounted out of alignment with respect to a specified location in the cavity CAV due to a margin of error in image-processing and in movements of a hand arm of an assembly robot. This margin of error can be absorbed if the first metal film 57 is larger than the transparent region 29.

The laser beam L can be irradiated, from outside the lid 53, after the lid 53 has been bonded to side walls 59 of the package PKG. The laser beam L irradiates the first metal film 57 by passing through the lid 53 and the transparent region 29b to the second metal films 28b, depending upon the x-axis and y-axis coordinates of the radiating position. The transparent region 29b allows coarse and fine adjustments to be made to the vibration frequency of the device, due to the length thereof.

Adjusting the Frequency of the Second Embodiment of the Piezoelectric Device

Figure 6A:
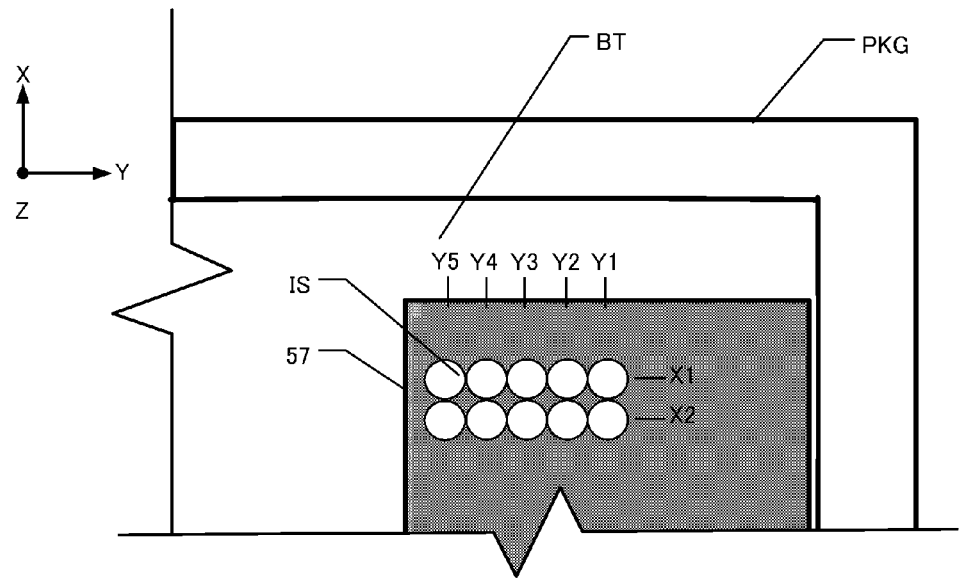
FIG. 6A is a plan view of an array of irradiation spots on a first metal film on a bottom main surface of the package of the first embodiment.
Figure 6B:
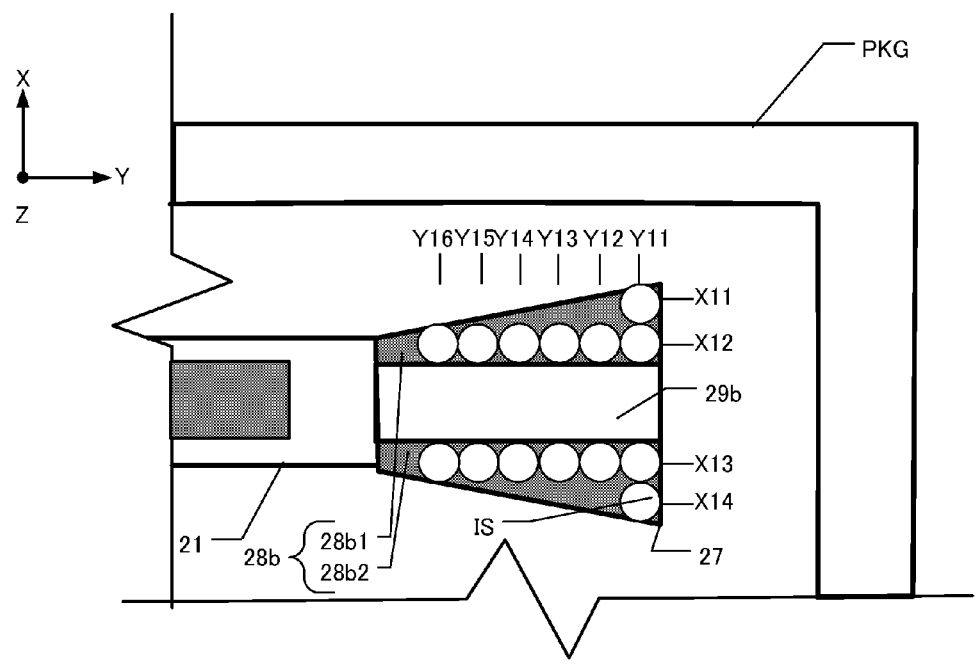
FIG. 6B is a plan view of an array of irradiation spots on the terminal wide region on the end of a vibrating arm of the second embodiment.

FIG. 6A is a plan view of possible irradiation spots IS of the laser beam L on the first metal film. The particular irradiation spot IS illuminated by the laser beam L at any particular moment is determined by the frequency-adjustment apparatus. FIG. 6B is a plan view of possible irradiation spots IS on the second metal films 28b.

As described above, the first metal film 57 is situated beneath the transparent region 29b. The first metal film 57 is aligned with the wide portions 27 on the distal ends of the vibrating arms 21. Since the width of the first metal film 57 is in the range of 220% to 400% the width of one fan-shaped wide portion 27, and since the length of the first metal film 57 is in the range of 120% to 150% the length of the wide portion 27, FIG. 6A depicts a portion of the under-surface of the transparent region 29b. Ten irradiation spots IS are arranged such that their respective coordinates (X1, Y1) to (X2, Y5), arrayed in two rows in the x-axis direction and five rows in y-axis direction, do not overlap each other.

The amount by which the vibration frequency of the piezoelectric device 110 varies depends upon the irradiation position on the first metal film 57. The laser beam L is incident to the irradiating spots IS in the first row (X1, Y1) and (X2, Y1) for making coarse frequency adjustments; this is because the vibration frequency is increased the largest amount when the beam is incident on the first row. The laser beam L is irradiated on the irradiation spots IS in the fifth row (X1, Y5) and (X2, Y5) for making fine frequency adjustments; this is because vibration frequency is increased by the smallest amount when the beam is incident on the fifth row. As the laser beam L is irradiated on an irradiation spot IS located anywhere in the first to fifth rows, the frequency-adjustment apparatus calculates the respective amount by which the vibration frequency (in Hz) can be reduced; a processor of the frequency-adjustment apparatus stores this data. The frequency-adjustment apparatus also determines the respective irradiation dose for each row, based on the difference between the measured vibration frequency and the target frequency, and reduces the vibration frequency of the piezoelectric device 110 accordingly.

In FIG. 6B the irradiation spots IS are arranged to form a total of twelve coordinates (X12, Y11) to (X13, Y16), in two rows in the x-axis direction and six rows in the y-axis direction that do not overlap each other. Two irradiation spots IS in the x-axis direction (X11, X14) are also placed in the first row.

The amount by which the vibration frequency produced by the piezoelectric device 110 can be changed varies as a function of location at which the laser beam irradiates the second metal films 28b. The laser beam L is incident on any of the irradiation spots IS in the first row (X12, Y11) and (X13, Y11) for making coarse adjustments, since the vibration frequency is most increased when the beam irradiates the first row. The laser beam L is incident on any of the irradiation spots IS in the sixth row (X12, Y16) and (X13, Y16) for making fine adjustments, since the vibration frequency is increased least when the beam irradiates the sixth row. If the measured vibration frequency is lower than the target frequency by a large difference, the laser beam L can be irradiated on the irradiation spots IS in the first row (X11 and X14). The frequency-adjustment apparatus controllably irradiates the laser beam L by combining the respective irradiation doses applied as required to each row, based on the difference between the measured vibration frequency and the target frequency, thereby reducing the vibration frequency of the piezoelectric device 110.

As described explained above, increasing the vibration frequency by making coarse and fine adjustments, and reducing the vibration frequency by making coarse and fine adjustments are now possible since the transparent region 29b is formed parallel to the sides 28b1 and 28b2 of the second metal films 28b.

Third Embodiment of Piezoelectric Device

Figure 7A:
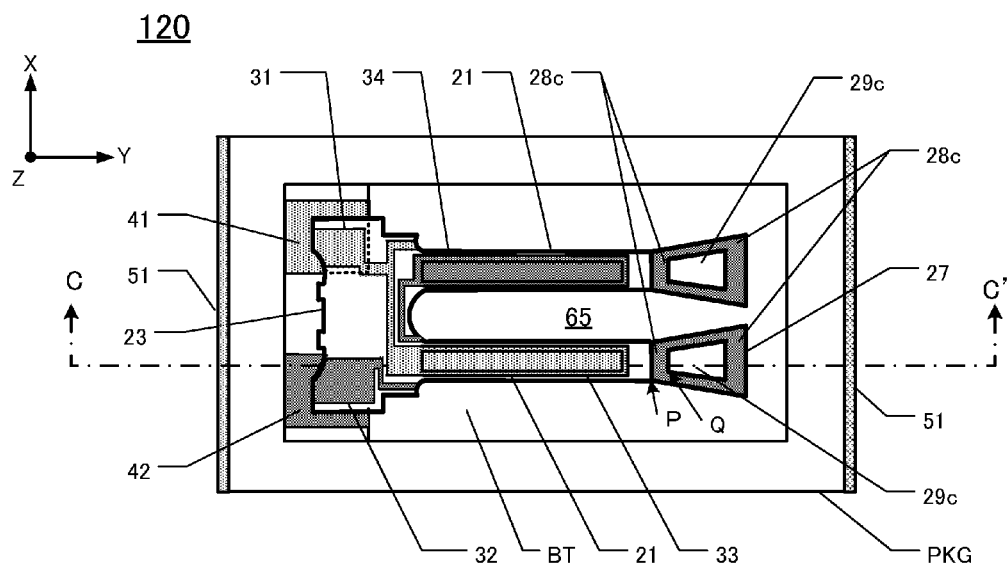
FIG. 7A is a plan view of a third embodiment of a piezoelectric device.
Figure 7B:
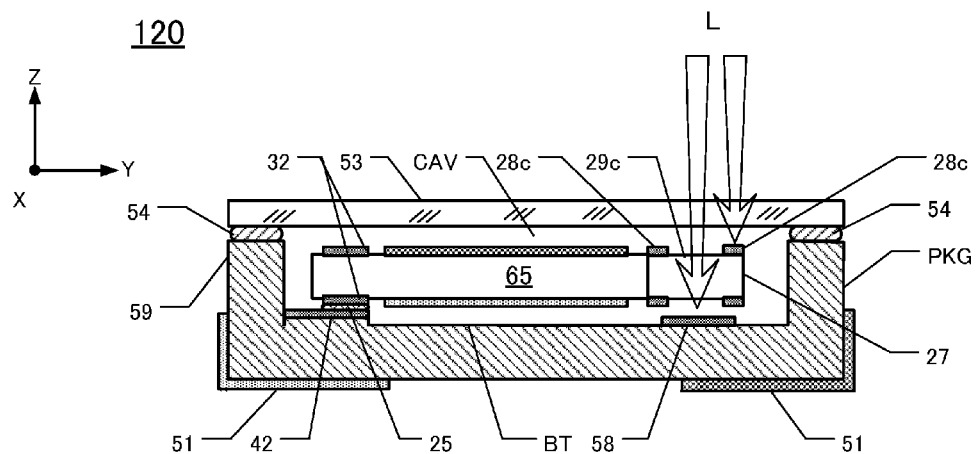
FIG. 7B is a cross-sectional view along the line C-C' in FIG. 7A.

FIG. 7A is a plan view of this embodiment of a piezoelectric device 120, and FIG. 7B is a cross-section along the line C-C' in FIG. 7A. The difference between this embodiment and the second embodiment is that, in the third embodiment 120, the tuning-fork type crystal vibrating piece 65 mounted in the package PKG has a pair of fan-shaped first metal films 58, instead of one large first metal film 57 as used in the second embodiment.

The third embodiment of a piezoelectric device 120 is fabricated by mounting the tuning-fork type crystal vibrating piece 65 inside a cavity CAV defined in a package PKG, and bonding a lid 53 to the package PKG in a vacuum using a sealing material 54. In the following description, components that are similar to corresponding components in the second embodiment have the same respective reference numerals and are not described further below.

As shown in FIG. 7A, each vibrating arm 21 includes a fan-shaped wide portion 27. Each fan-shaped wide portion 27 gradually spreads outward (in the x-direction) from the point P to the distal end, forming a fan-shaped structure. Each wide portion 27 includes AE respective second metal film 28c and transparent region 29c. Normally, the transparent region 29a allows underlying structure to be viewed through the region; in FIG. 7A, however, underlying structure is not shown, to facilitate clarity.

At the point denoted "Q" in FIG. 7A, the transparent region 29c has about the same width or is narrower than the vibrating arms 21. Rightward from the point Q, the width progressively increases, resulting in a fan-shaped structure. The length (y-direction) of the transparent region 29c is in the range of 60% to 90% of the length of the wide portion 27. Each of the second metal films 28c has a trapezoidal frame shape, with four sides 28c1 to 28c4 (FIG. 8). These sides collectively constitute a region which a laser beam L (FIG. 8) can be irradiated; hence, the width desirably is about the same as the diameter of an irradiation spot IS (FIG. 4) of the laser beam L, or larger. Also, the side 28c of the second metal film 28a is parallel (y-axis direction) to the transparent region 29a.

As shown in FIGS. 7A and 7B, a pair of fan-shaped first metal films 58 is formed on the bottom surface BT of the cavity CAV in the package PKG. The first metal films 58 are formed directly beneath the respective transparent regions 29c. Each first metal film 58 has a width that is in the range of 110% to 130% the width of the distal end of the respective fan-shaped transparent region 29c, and that is in the range of 110% to 130% the width of the proximal end of the respective transparent region. The length of each first metal film 58 is in the range of 110% to 130% the length of the transparent region 29c.

A laser beam L can be irradiated into the cavity CAV from outside the lid 53, while the lid 53 is bonded to the upper surface of the side wall 59 of the package PKG. The laser beam L irradiates the first metal films 58 by passing through the lid 53 and transparent region 29c, and irradiates the second metal films 28c by passing through the lid 53, depending upon the x-axis and y-axis coordinates of the irradiation locations.

Frequency Adjustment of Piezoelectric Device

Figure 8A:
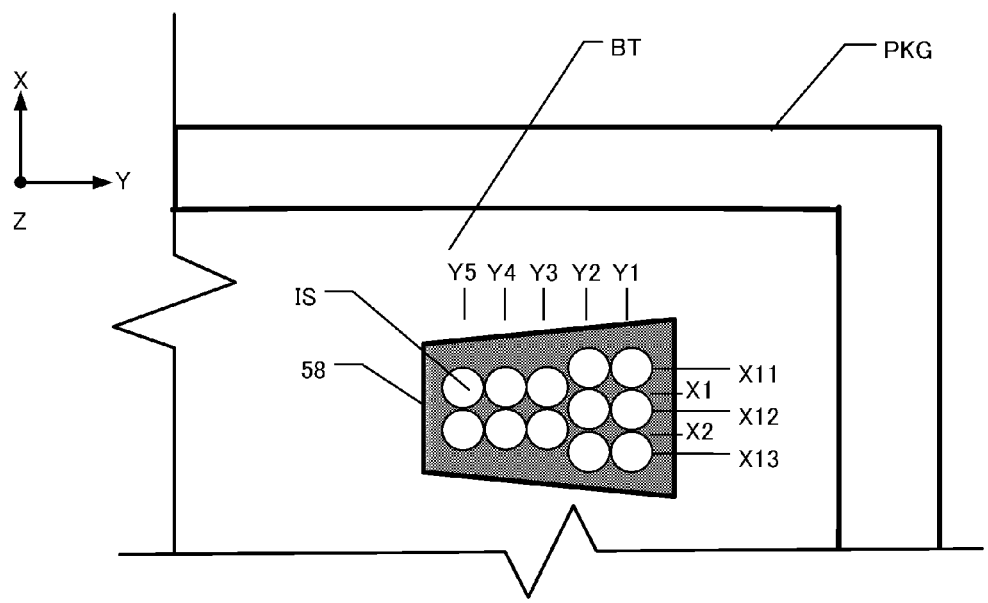
FIG. 8A is a plan view of an array of irradiation spots on first metal film on a bottom main surface of the package of the third embodiment.
Figure 8B:
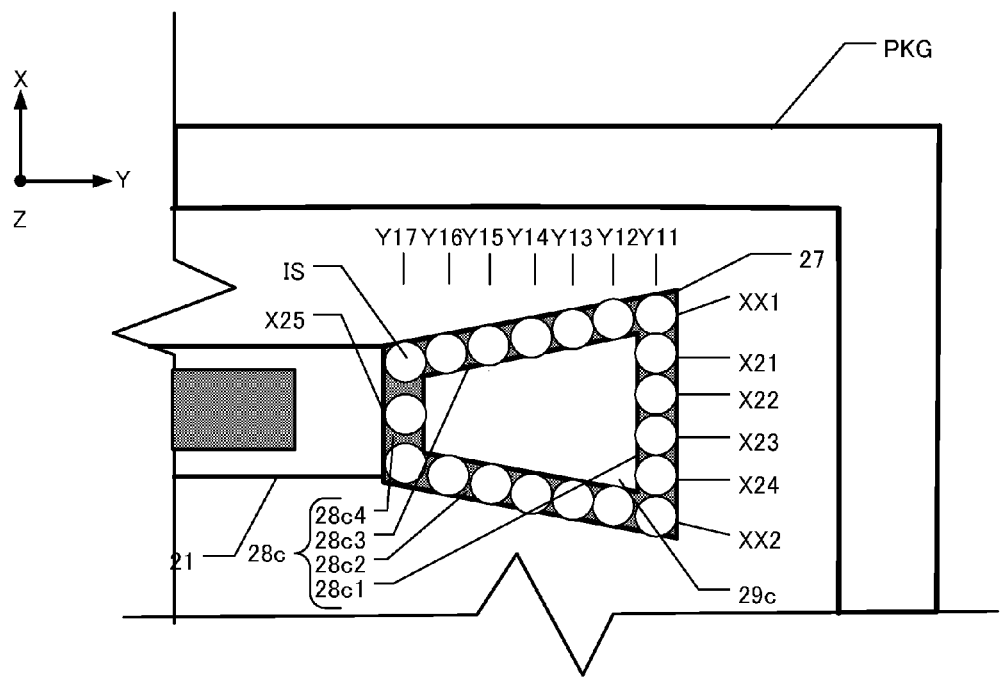
FIG. 8B is a plan view of an array of irradiation spots on the end of a vibrating arm of the third embodiment.

FIGS. 8A-8B depict the irradiation spots IS of the laser beam L for frequency-adjustment purpose, and also all irradiation positions of the laser beam L. FIG. 8A shows the irradiating spots IS for irradiating the laser beam onto the first metal films 58 on the bottom surface BT of the package. FIG. 8B shows the irradiating spot IS, as irradiated onto a second metal film 28b.

As described with reference to FIG. 7B, the first metal film 58 has a width that is in the range of 110% to 130% width of the distal end of the transparent region 29c and 110% to 130% of the other distal end. The first metallic film 58 also has a length that is in the range of 110% to 130% the length of the transparent region 29c. FIG. 8A shows that the center of each transparent region is aligned with the center of the respective first metal film 58. Hence, respective irradiating spots IS are arranged at a total of twelve coordinates, consisting of two rows in the x-axis direction (X11, X12), three rows in the x-axis direction (X1 to X3), and five columns in the y-axis direction (Y1 to Y5), yielding the coordinates (X1, Y1) to (X3, Y2) and (X11, Y3) to (X12, Y5). The coordinates do not overlap each other.

The amount by which the vibrating frequency of the third piezoelectric device 120 can be varied depends on the beam positions used for irradiating the first metal films 58. The laser beam L is directed onto the irradiation spots IS in the first row (X1, Y1), (X2, Y1), and (X3, Y1) to make coarse frequency adjustments, since the vibrating frequency is reduced most when the beam is irradiated anywhere in the first row. The laser beam L is directed onto the irradiation spots IS in the fifth row (X11, Y5) and (X12, Y5) for making fine frequency adjustments, since the vibration frequency is reduced least when the beam is irradiated anywhere in the fifth row. Whenever the laser beam L is irradiated onto one irradiation spot IS in any of the first to fifth rows, the frequency-adjustment apparatus measures the corresponding reduction of vibration frequency, in Hz, and stores the resulting data in the frequency-adjustment apparatus. The frequency-adjustment apparatus calculates the respective dose of radiation to each row based on the difference between the measured vibrating frequency and the target frequency, and accordingly reduces the vibration frequency of the third piezoelectric device 120.

In FIG. 8B, the irradiation spots IS are arranged such that a total of fourteen coordinates, two rows along a slanted direction to the second metal films 28c and seven row to the y-axis direction (XX11, Y11) to (XX12, Y17), do not overlap each other. The figure depicts five irradiation spots IS, four on the first row and one on the seventh row.

The amount by which the vibration frequency of the piezoelectric device 120 according to this embodiment can be adjusted depends upon the incidence location of the beam on the second metal films 28c. The laser beam L is irradiated onto the irradiation spots IS in the first row (XX1, Y11), (X21, Y11), (X22, Y11), (X23, Y11), (X24, Y11) and (XX2, Y11) to make coarse frequency adjustments; this is because the vibration frequency is reduced most whenever the laser beam is irradiated onto the first row. The laser beam L also can be irradiated onto the irradiation spots IS in the seventh row (XX1, Y17), (XX2, Y17), and (X25, Y17) for making fine adjustments of vibration frequency, since the vibration frequency is reduced least whenever the laser beam L is irradiated onto the seventh row. The frequency-adjustment apparatus directs the laser beam L for irradiation according to a predetermined respective dose of radiation for each row. The doses are calculated based on the stored data regarding the difference between the measured vibration frequency and the target frequency, thereby increasing the vibration frequency of the piezoelectric device 120.

As described above, increasing the vibration frequency by making coarse frequency adjustments and fine frequency adjustments and reducing the vibration frequency by making coarse adjustments and fine adjustments are now possible since the transparent region 29c extends to the distal ends of the wide portions 27 of the vibrating arms, similar to the second metal films 28c. Also, since the transparent regions 29c are inside the respective frames of the second metal films 28c, the metals irradiated by the laser beam L and evaporated from the first metal frame 56 adhere to the wide portions 27.

Examples Tuning-Fork Type Crystal Vibrating Pieces

Figure 9A:
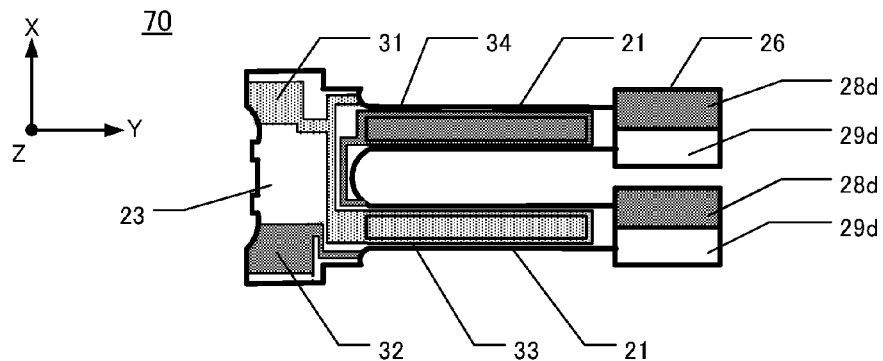
FIG. 9A is a plan view of a first example of a tuning-fork type crystal vibrating piece.
Figure 9B:
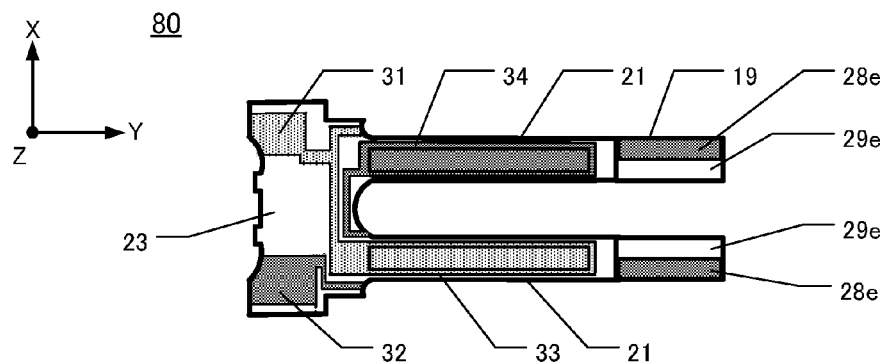
FIG. 9B is a plan view of a second example of a tuning-fork type crystal vibrating piece.
Figure 9C:
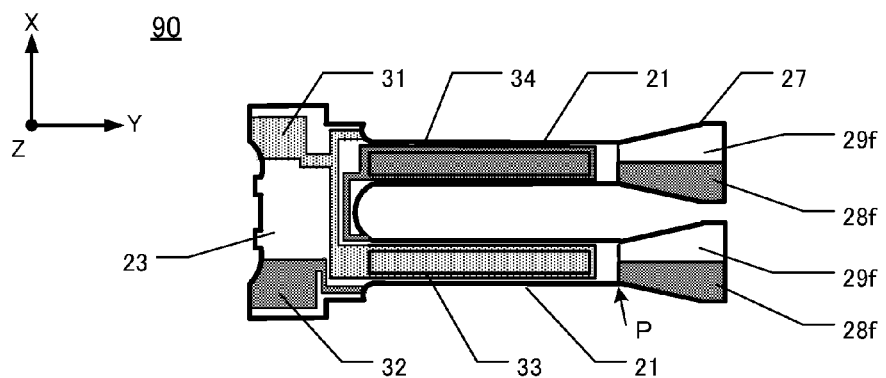
FIG. 9C is a plan view of a third example of a tuning-fork type crystal vibrating piece.

FIGS. 9A-9C depict respective example profiles of the second metal films of the transparent regions formed on the distal ends of the vibrating arms 21. FIG. 9A is a plan view of a first example of a tuning-fork type crystal vibrating piece 70; FIG. 9B is a plan view of a second example of a tuning-fork type crystal vibrating piece 80; and FIG. 9C is a plan view of a third example of a tuning-fork type crystal vibrating piece 90. In the following descriptions of the examples, components that are similar to corresponding components in the first embodiment have the same respective reference numerals and are not described further below.

Referring to FIG. 9A, the subject tuning-fork type crystal vibrating piece 70 has the same profile outline as the first embodiment 50. The difference between this example 70 and the first embodiment 50 is that, in this example the respective shapes of the second metal films 28d and of the transparent regions 29d on the wide portions 26 of the vibrating arms are different. The metal films 28d (in the x-axis direction) and the transparent regions 29d (in the x-axis direction) both have half the width (x-axis direction) of the wide portion 26. The length of each second metal film 28d (y-axis direction) and the length (y-axis direction) of each transparent region 29d are equal to the length of the wide portion 26. A pair of second metal films 28d extend in the +x-axis direction. Since each transparent region 29d is parallel to the respective second metal films 28d, it is possible to increase vibration frequency by making a coarse adjustment and a fine adjustment and to reduce vibration frequency by making at least a coarse frequency adjustment.

Referring to FIG. 9B, the subject tuning-fork type crystal vibrating piece 80 includes a pair of vibrating arms 21 that extend with uniform width from the base 23 to the distal ends in the y-axis direction. The distal ends of the vibrating arms 21 include weights 19 on which the second metal films 28e and the transparent regions 29e are formed. Each of the second metal films 28e and transparent regions 29e has a respective width that is half the width of the wide portion 21 of the vibrating arms. The length of each second metal film 28e and the length of each transparent region 29e is equal to the length of the weight 19. A respective second metal film 28e is formed on the outer surface (+/−x-axis direction) of each vibrating arm 21. Since the transparent region 29e is formed parallel to the second metal films 28e, increasing the vibration frequency by making respective coarse adjustments and fine adjustments and reducing the vibration frequency by making respective coarse adjustments and fine adjustments are now possible. Although the width of each vibrating arm 21 is constant from the base 23 to the distal end, and the weight 19 is wider than it appears in FIG. 9B (which can make frequency adjustments difficult), the wide space between the weights 19 increases their resistance to physical impacts.

Turning now to FIG. 9C, the subject tuning-fork type crystal vibrating piece 90 includes vibrating arms that spread outward from the point P to their distal ends but do not strike each other during vibration. The resulting fan-shaped structures are called wide portions 27. The wide portions 27 include second metal films 28f used for making frequency adjustments. Each wide portion 27 also includes a respective transparent region 29f. Each second metal film 28f and each transparent region 29f has a width that is half the width of the wide portion 27. Each second metal film 28f and each transparent region has a length that is equal to the length of the respective wide portion 27. Each wide portion also includes a second metal film 28f on the +x-axis side of the wide portion. Since the transparent region 29f is parallel to the second metal film 28f, increasing the vibration frequency by making respective coarse adjustments and fine adjustments and reducing the vibration frequency by making respective coarse adjustments and fine adjustments are now possible. Also, since the distal ends of the vibrating arms are wide compared to those as shown in FIG. 9A, coarse adjustments are easy to perform.

Although not particularly shown in FIGS. 9A-9C, the first metal films disposed on the bottom surface BT of the package are formed in accordance with the respective shapes of the transparent regions 29d, 29e, 29f.

Fourth Embodiment of Piezoelectric Device

Figure 10A:
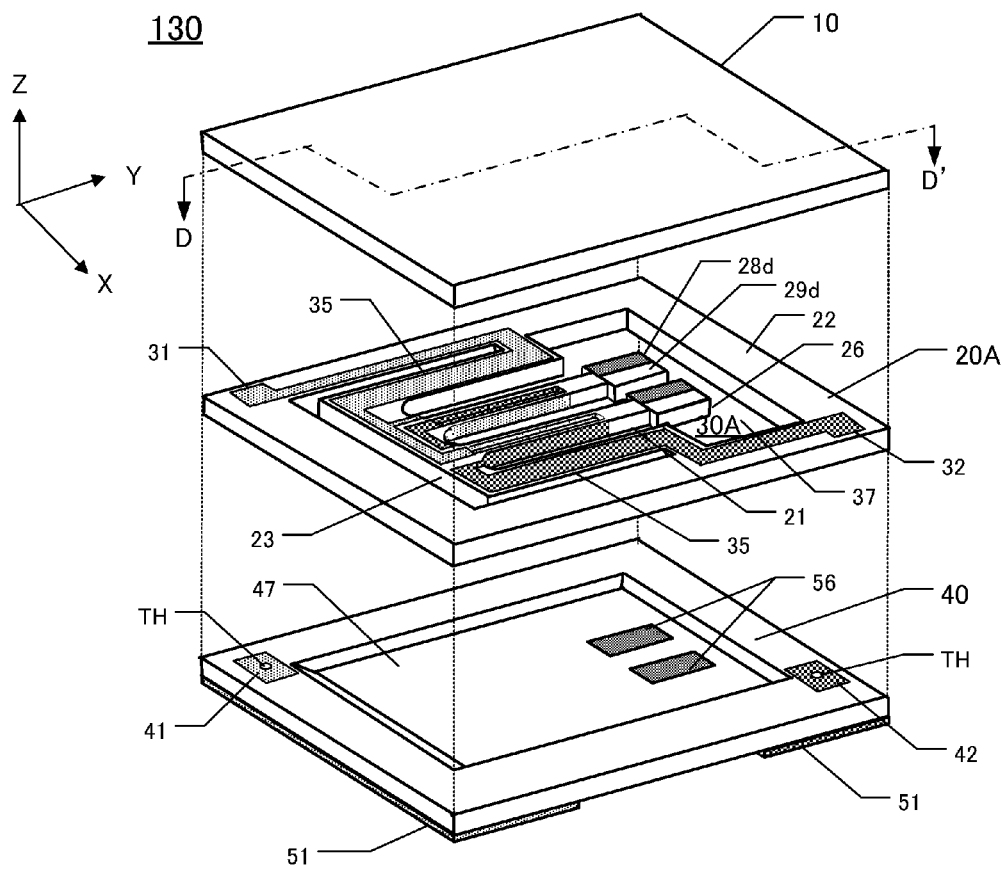
FIG. 10A is a perspective view of a fourth embodiment of a piezoelectric device.
Figure 10B:
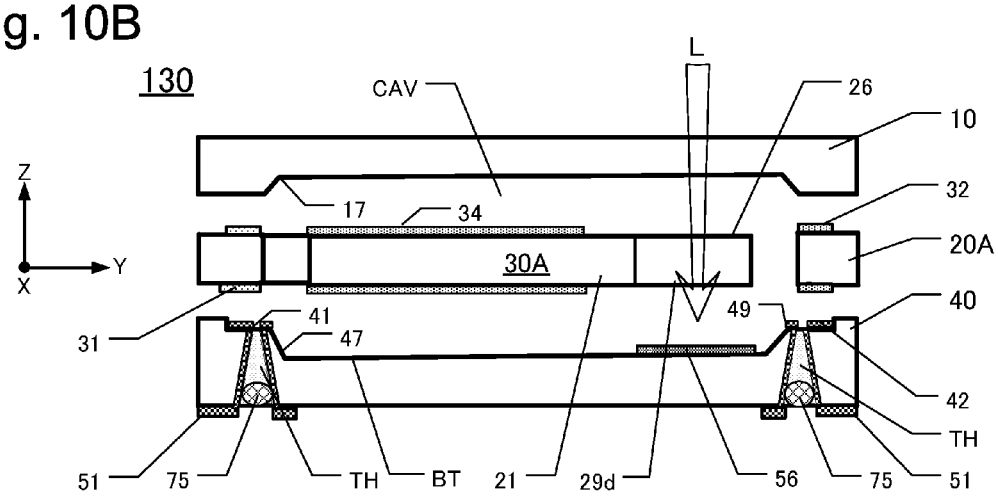
FIG. 10B is a cross-sectional view along the line D-D' in FIG. 10A.

FIG. 10A is a schematic exploded view of this fourth embodiment of a piezoelectric device 130 including a tuning-fork type crystal vibrating piece 30A. FIG. 10B is an elevational section along the line D-D' in FIG. 10A, before bonding.

This embodiment 130 comprises a top lid 10, a first crystal frame 20A, and a base plate 40. The lid 10, first crystal frame 20A, and base plate 40 are all fabricated of crystal materials. The first crystal frame 20A includes the tuning-fork type crystal vibrating piece 30A, sandwiched between the lid 10 and base plate 40. The lid 10 is bonded to an upper main surface of the crystal frame 20A, and the base plate 40 is bonded to the lower main surface of the crystal frame 20A. The lid 10 and base plate 40 are bonded to the crystal frame 20A by siloxane bonding (Si-O-Si). Through-holes TH are sealed with a sealing material 75.

The crystal frame 20A comprises the crystal vibrating piece 30A, which includes a base 23, vibrating arms 21, a frame portion 22, and supporting arms 35. A void 37 is defined between the crystal vibrating piece 30A and the frame portion 22. The void 37, which establishes the outer shape of the crystal vibrating piece 30A, is formed by etching. The thickness of the vibrating piece 30A is equal to the thickness of the frame portion 22. The base 23, vibrating arms 21, frame portion 22, and supporting arms 35 are all formed as an integral unit. The vibrating arms 21 extend in the y-axis direction from the base 23. First and second base electrodes 31 and 32 are disposed on the first and second main surfaces, respectively, of the base unit 23, frame portion 22, and supporting arms 35.

The vibrating arms 21 extend in the y-axis direction at a uniform width, and include respective distal wide portions 26. Each wide portion 26 includes a respective second metal film 28d used for making vibration-frequency adjustments. Each wide portion 26 also includes a respective transparent region 29d (see FIG. 9A). The second metal films 28d and the transparent regions 29d each have half the width of a wide portion 26. The second metal films 28 and the transparent regions 29d each have the same length as a wide portion 26, up to the distal ends of the wide portions 26.

In FIGS. 10A and 10B, the lid 10 includes a concavity 17 on its inner main surface (i.e., surface facing the crystal frame 20A). The base plate 40 includes a concavity 47 on its inner main surface (i.e., surface facing the crystal frame 20A). The bottom of the concavity is the bottom surface BT. The base plate 40 defines through-holes TH and steps 49. First and second connecting electrodes 41 and 42 are disposed in respective steps 49 and are connected to respective through-holes TH. A pair of first metal films 56 is formed on the bottom surface BT of the base plate 40. External electrodes 51 are situated on the outer main surface of the base plate 40. Each through-hole TH includes a respective metal film formed on the inner surface of the through-hole. The metal film in the through-holes TH, the external electrodes 51, and the first and second connecting electrodes 41 and 42 are formed by a process comprising photolithography.

After the lid 10, crystal frame 20A, and base plate 40 are bonded together, a laser beam L can be irradiated into the piezoelectric device 130 and into the cavity CAV from outside the lid 10 for making adjustments of vibration frequency. By passing the laser beam L through the lid 10 and transparent region 29d to irradiate the first metal films 56, and by passing the laser beam L through the lid 10 to irradiate the second metal films 28d, the vibration frequency of the device can be increased or reduced, depending upon the x-axis direction and/or y-axis direction from which the laser beam is irradiating these films.

Fifth Embodiment of Piezoelectric Device

Figure 11A:
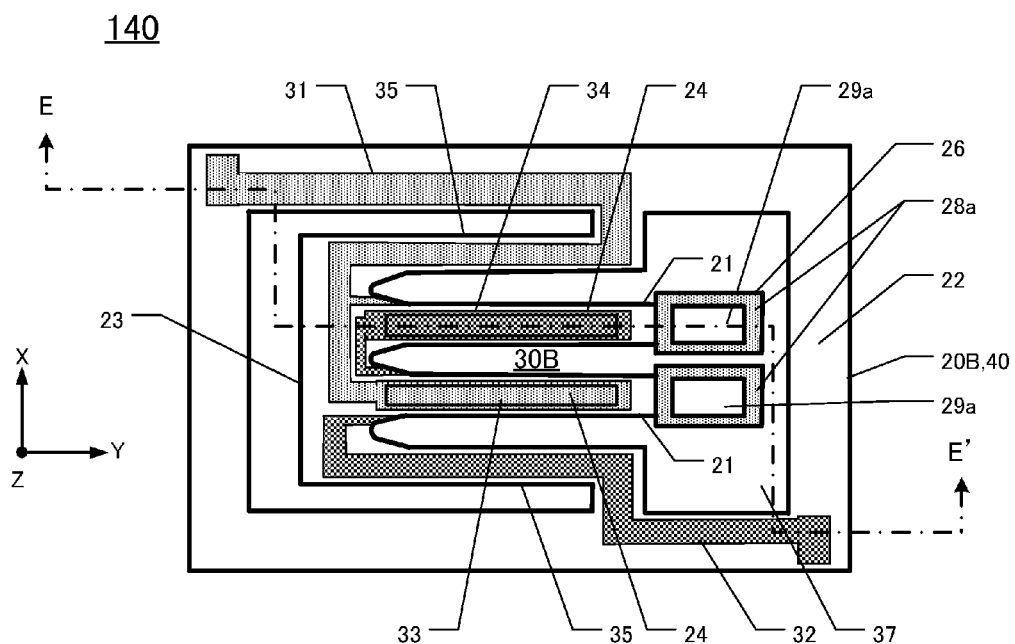
FIG. 11A is a plan view of a fifth embodiment of piezoelectric device.
Figure 11B:
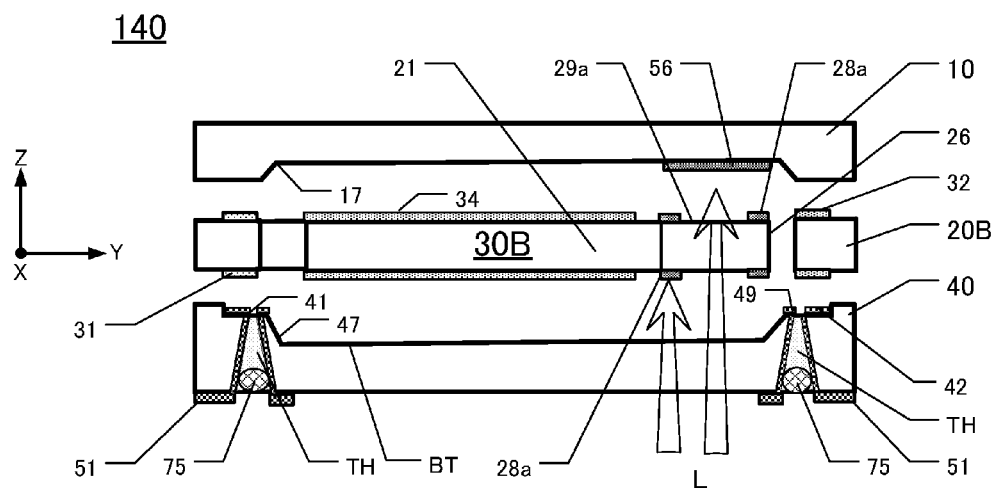
FIG. 11B is a cross-sectional view along the line E-E' in FIG. 11A.

This embodiment is shown in FIGS. 11A and 11B. FIG. 11A is plan view of the piezoelectric device 140 of this embodiment with the lid 10 removed. FIG. 11B is a cross-sectional view along the line E-E' in FIG. 11A, before bonding. This embodiment of a piezoelectric device 140 comprises a lid 10, a crystal frame 20B, and a base plate 40. The lid 10, crystal frame 20B, and base plate 40 are all fabricated from crystal materials. The crystal frame 20B includes a tuning-fork type crystal vibrating piece 30B.

In this embodiment 140 the frame portion 22 of the crystal frame 20B is sandwiched between the lid 10 and the base plate 40 and bonded thereto by siloxane bonding. The differences between the piezoelectric device 140 of this embodiment compared to the fourth embodiment concern the shape of the transparent region 29a compared to the shape of the transparent region 29d in the fourth embodiment 130. Also, there are differences in the manner in which the first metal films 56 on the lid 10 of this embodiment 140 are formed compared to the manner in which the first metal films are formed in the fourth embodiment. In the following description, components that are similar to corresponding components of the fourth embodiment have the same respective reference numerals and are not described further below.

In FIG. 11A, each vibrating arm 21 includes a respective distal wide portion 26. Each wide portion 26 includes a respective second metal film 28a used for performing frequency adjustments. Each wide portion also includes a respective transparent region 29a. Each transparent region 29a is situated in the center of the respective wide portion 26 and is extended somewhat in the y-axis direction. The second metal films 28a are peripheral to the respective transparent regions 29a.

As shown in FIG. 11B, the lid 10 includes a pair of first metal films 56 on the inner main surface (facing the respective transparent regions 29a on the wide portions 26). After the lid 10, crystal frame 20A, and base plate 40 have been bonded together, the piezoelectric device 140 can be irradiated from the lower main surface of the base plate 40 (i.e., from outside the package) for making frequency adjustments. More specifically, the laser beam L is irradiated from outside the base plate 40 to the cavity CAV. The laser beam L passes through the base plate 40 and through the transparent regions 29a to irradiate the first metal films 56. The laser beam L passes through the base plate 40 to irradiate the second metal films 28a. Thus, the vibration frequency can be increased or reduced, depending upon the x-axis direction and/or y-axis direction from which a laser beam is irradiating these films.

Representative embodiments are described above; however, it will be obvious to persons who are skilled in the relevant art to modify the invention based on this disclosure. For example, if the lid is formed of a material that transmits light, the laser beam L can be irradiated onto the first metal films by passing through the lid. If the lid is fabricated of a material that does not transmit light (e.g., kovar alloy), first metal films can be irradiated by the laser beam L passing through the transparent regions on the vibrating arms before the lid is bonded to the package.

Furthermore, although an oscillating circuit is not shown mounted inside the piezoelectric devices of the various embodiments, it will be understood that any of the packages disclosed herein can accommodate an integrated circuit in the manner of devices called piezoelectric oscillators.

What is claimed is:

1. A piezoelectric device, comprising:
  a tuning-fork type piezoelectric vibrating piece; and
  a package containing the piezoelectric vibrating piece, wherein
  the piezoelectric vibrating piece comprises a base fabricated of a piezoelectric material, first and second vibrating arms extending from the base parallel to each other in a first direction, and respective frequency-adjustment units on respective distal ends of the vibrating arms; and
  the package comprises a first metal film on an inner main surface of the package at which a laser beam can be irradiated;
  each frequency-adjustment unit comprises a second metal film extending at least in the first direction and a transparent region extending, parallel to the second metal film, at least in the first direction, the transparent region being transmissive to a laser beam having a power and wavelength sufficient to evaporate material from the first and second metal films if the laser beam is incident on respective ones or both of the first and second metal films.

2. The piezoelectric device of claim 1, wherein:
  the package comprises a base plate having a bottom surface facing the piezoelectric vibrating piece in the package, and a laser-transparent lid having a ceiling surface facing the piezoelectric vibrating piece in the package, thereby sealing the package; and the first metal films are situated on the bottom surface of the base plate.

3. The piezoelectric device of claim 2, wherein the second metal film of the frequency-adjustment unit sandwiches the transparent region unit in a second direction that is orthogonal to the first direction.

4. The piezoelectric device of claim 2, wherein:
each vibrating arm has a width in a second direction orthogonal to the first direction; and
each frequency-adjustment unit has a width, in the second direction, that is greater than the width of a vibrating arm in the second direction.

5. The piezoelectric device of claim 4, wherein the width of each frequency-adjustment unit extends from the distal end of the respective vibrating arm to a respective distal end of the frequency-adjustment unit.

6. The piezoelectric device of claim 4, wherein the width of each frequency-adjustment unit is uniform over distance in the first direction, and is greater than the width of the respective vibrating arm.

7. The piezoelectric device of claim 1, wherein:
the package comprises a base plate that is transparent to the laser and that has a bottom surface facing the piezoelectric vibrating piece in the package, and a lid having a ceiling surface facing the piezoelectric vibrating piece in the package, thereby sealing the package; and
the first metal films are situated on the ceiling surface of the lid.

8. The piezoelectric device of claim 7, wherein the second metal film of the frequency-adjustment unit sandwiches the transparent region unit in a second direction that is orthogonal to the first direction.

9. The piezoelectric device of claim 7, wherein:
each vibrating arm has a width in a second direction orthogonal to the first direction; and
each frequency-adjustment unit has a width, in the second direction, that is greater than the width of a vibrating arm in the second direction.

10. The piezoelectric device of claim 9, wherein the width of each frequency-adjustment unit extends from the distal end of the respective vibrating arm to a respective distal end of the frequency-adjustment unit.

11. The piezoelectric device of claim 9, wherein the width of each frequency-adjustment unit is uniform over distance in the first direction, and is greater than the width of the respective vibrating arm.

12. The piezoelectric device of claim 1, wherein:
each vibrating arm has a width in a second direction orthogonal to the first direction; and
each frequency-adjustment unit has a width, in the second direction, that is greater than the width of a vibrating arm in the second direction.

13. The piezoelectric device of claim 12, wherein the width of each frequency-adjustment unit extends from the distal end of the respective vibrating arm to a respective distal end of the frequency-adjustment unit.

14. The piezoelectric device of claim 12, wherein the width of each frequency-adjustment unit is uniform over distance in the first direction, and is greater than the width of the respective vibrating arm.

15. The piezoelectric device of claim 1, wherein the second metal film of the frequency-adjustment unit sandwiches the transparent region unit in a second direction that is orthogonal to the first direction.

\* \* \* \* \*